US007032156B2

(12) United States Patent
Yu et al.

(10) Patent No.: US 7,032,156 B2
(45) Date of Patent: Apr. 18, 2006

(54) APPARATUS AND METHOD FOR REDUCING BIT ERROR RATES (BER) AND FRAME ERROR RATES (FER) USING TURBO DECODING IN A DIGITAL COMMUNICATION SYSTEM

(75) Inventors: Nam-Yul Yu, Suwon-shi (KR); Min-Goo Kim, Suwon-shi (KR); Sang-Hyuck Ha, Suwon-shi (KR)

(73) Assignee: Samsung Electronics Co., Ltd., (KR)

( * ) Notice: Subject to any disclaimer, the term of this patent is extended or adjusted under 35 U.S.C. 154(b) by 341 days.

(21) Appl. No.: 10/622,508

(22) Filed: Jul. 21, 2003

(65) Prior Publication Data

US 2004/0153956 A1    Aug. 5, 2004

(30) Foreign Application Priority Data

Jul. 19, 2002    (KR)    ...................... 10-2002-0042686

(51) Int. Cl.
*H03M 13/45*    (2006.01)
(52) U.S. Cl. ........................ 714/755; 714/780; 714/794
(58) Field of Classification Search ................ 714/755, 714/780, 794
See application file for complete search history.

(56) References Cited

U.S. PATENT DOCUMENTS

| | | | | | |
|---|---|---|---|---|---|
| 4,811,346 | A | * | 3/1989 | Battail ......................... | 714/792 |
| 5,181,209 | A | * | 1/1993 | Hagenauer et al. ......... | 714/795 |
| 5,414,738 | A | * | 5/1995 | Bienz .......................... | 375/341 |
| 5,844,946 | A | * | 12/1998 | Nagayasu .................... | 375/341 |
| 5,867,538 | A | * | 2/1999 | Liu ............................. | 375/341 |
| 5,933,462 | A | * | 8/1999 | Viterbi et al. ................ | 375/341 |
| 6,301,684 | B1 | * | 10/2001 | Watanabe et al. ........... | 714/796 |
| 6,389,574 | B1 | * | 5/2002 | Belveze et al. ............. | 714/795 |
| 6,396,878 | B1 | * | 5/2002 | Piirainen ..................... | 375/262 |

(Continued)

FOREIGN PATENT DOCUMENTS

EP    1162750    3/2002

OTHER PUBLICATIONS

Yoon, Sangho, "Turbo Decoder Implementation", Proc. of IEEE 54th Vehicular Technology Conference, Atlantic City, USA, vol. 1 of 4, conf. 54, pp. 1824-1828, Oct. 2001.

(Continued)

*Primary Examiner*—Stephen M. Baker
(74) *Attorney, Agent, or Firm*—Roylance, Abrams, Berdo & Goodman, L.L.P.

(57) ABSTRACT

An Forward Error Correction (FEC) apparatus and method for reducing Bit error rates (BER) and Frame Error Rates (FER) using turbo decoding in a digital communication system. In a constituent decoder for decoding a turbo code, a first adder calculates the LLR of a received code symbol by calculating the difference between the probability of the code symbol being 1 and that of the code symbol being 0 at an arbitrary state of a turbo decoding trellis. A second adder adds the transmission information and a priori information of the code symbol. A third adder calculates the difference between the outputs of the first and second adders as extrinsic information. A first multiplier multiplies the output of the third adder by a predetermined weighting factor as a feedback gain. A correction value calculator calculates a correction value using the difference between the best metric and the second best metric of the code symbol. A fourth adder adds the correction value to the output of the first multiplier.

9 Claims, 16 Drawing Sheets

U.S. PATENT DOCUMENTS

| | | | |
|---|---|---|---|
| 6,476,739 B1 * | 11/2002 | Lui et al. | 341/107 |
| 6,487,255 B1 * | 11/2002 | Arslan et al. | 375/262 |
| 6,529,559 B1 * | 3/2003 | Reshef | 375/262 |
| 6,668,026 B1 * | 12/2003 | Miyauchi | 375/341 |
| 6,697,443 B1 * | 2/2004 | Kim et al. | 375/341 |
| 6,748,035 B1 * | 6/2004 | Piirainen | 375/341 |
| 2002/0040461 A1 | 4/2002 | Miyauchi | 714/758 |

OTHER PUBLICATIONS

Classon B., et al.,"Turbo Decoding with the Constant-Log-MAP Algorithm", Proc. of the 2$^{nd}$ Intern. Symposium on Turbo Codes and Related Topics, Brest, France, pp 467-470, Sep. 2000.

Ericsson Inc., "Simplified Log-MAP Algorithm", Research Disclosure, Kenneth Mason Publications, Hampshire, GB, vol. 421, No. 33, May 1999.

Cheng, J-F, et al., "Linearly Approximated Log-Map Algorithms for Turbo Decoding", Proc. of IEEE 51$^{st}$ Vehicular Technology Conference, Tokyo, Japan, vol. 3, conf. 51, pp. 252, 255, May 2000.

Chaikalis, C., et al., "Improving the Reconfigurable SOVA/log-MAP Turbo Decoder for 3GPP", Proceedings of Third International Symposium on Communication Systems Networks and Digital Signal Processing, stoke on Trent, UK, pp. 105-108, Jul. 2002.

Vogt, J., et al., "Improving the Max-Log-MAP Turbo Decoder", Electronics Letters, IEE Stevenage, GB, vol. 36, No. 23, pp. 1937-1939, Nov. 2000.

Patrick Robertson et al., "A Comparison of Optimal and Sub-Optimal MAP Decoding Algorithms Operating in the Log Domain", *Proceeding of the IEEE Conference on Communications*, vol. 2, pp. 1009-1013 (Jun. 1995).

Peter H. -Y. Wu et al., "Implementation of a lw Complexity, Low Power, Integer-Based Turbo Decoder", *Proceeding of IEEE Global Telecommunications Conference*, vol. 2, pp. 946-951 (Nov. 2001).

* cited by examiner

BER performance of turbo code over iterations
(EP size = 3864, R=1/2, Eb/nO=1.3dB)

BER performance of turbo code over iterations
(EP size = 3864, R=1/2, Eb/nO=1.3dB)

BER performance of turbo code over iterations
(EP size = 792, R=1/5, Eb/nO=0.7dB)

BER performance of turbo code over Eb/No offset
(EP size = 3864, Eb/No=1.2dB)

BER performance of turbo code over Eb/No offset
(EP size = 3864, Eb/No=1.2dB)

APPARATUS AND METHOD FOR REDUCING BIT ERROR RATES (BER) AND FRAME ERROR RATES (FER) USING TURBO DECODING IN A DIGITAL COMMUNICATION SYSTEM

PRIORITY

This application claims priority under 35 U.S.C. § 119 to an application entitled "Apparatus and Method for Turbo Decoding" filed in the Korean Intellectual Property Office on Jul. 19, 2002 and assigned Serial No. 2002-42686, the contents of which are incorporated herein by reference.

BACKGROUND OF THE INVENTION

1. Field of the Invention

The present invention relates generally to a forward error correction (FEC) apparatus and method in a digital communication system, and in particular, to an apparatus and method for turbo decoding.

2. Description of the Related Art

In general, turbo codes are used for high-speed data communication, especially in Evolution Data Only (1×EV-DO) or Evolution Data and Voice (1×EV-DV). Berrou et. al. proposed the turbo codes in 1993. A turbo encoder is a parallel concatenation of two constituent Recursive Systematic Convolutional (RSC) encoders with a random interleaver in between. Thus, a turbo code is produced by encoding information bits and interleaved information bits in the RSC constituent encoders. Turbo decoding involves a serial concatenation of two constituent decoders, each for decoding iteratively, exchanging its extrinsic information with the other constituent decoder. There are three algorithms applicable for each constituent decoder: Log-MAP, Max-Log-MAP, and Soft Output Viterbi Algorithm (SOVA).

The Log-MAP algorithm is the log-domain implementation of a MAP algorithm which is optimal for decoding an information word in a trellis. The Max-Log-MAP algorithm is easily derived from the Log-MAP algorithm by an approximation of metric computation. Despite the advantage of simple implementation as compared to the Log-MAP algorithm, the Max-Log-MAP algorithm leads to performance degradation when perfect Signal-to-Noise Ratio (SNR) is possible at a receiver.

For the Log-MAP algorithm, state metrics and an Log Likelihood Ratio (LLR) are computed. State metrics $\alpha$ and $\beta$ for a state (s and s') in a trellis at decoding time k are in a recursive relation expressed as $$\log(\alpha_k(s)) = \log\left(\sum_s \alpha_{k-1}(s')\gamma_k(s', s)\right), \quad (1)$$

$$\log(\beta_{k-1}(s')) = \log\left(\sum_s \beta_k(s)\gamma_k(s', s)\right)$$

where $\gamma$ is a branch metric defined by a symbol received on a channel. Using the state metrics and the branch metric, the LLR of a kth symbol is obtained by $$L(\hat{u}_k) = \log\left(\frac{\sum_{(s',s),u_k=0} \alpha_{k-1}(s')\gamma_k(s', s)\beta_k(s)}{\sum_{(s',s),u_k=1} \alpha_{k-1}(s')\gamma_k(s', s)\beta_k(s)}\right) \quad (2)$$

$$= \log\left(\frac{\sum_i e^{M_0(i)}}{\sum_i e^{M_1(i)}}\right)$$

$$= M_0(0) - M_1(0) + f_c$$

where, $$f_c = \log\left(1 + \sum_{i\neq 0} e^{-(M_0(0)-M_0(i))}\right) - \log\left(1 + \sum_{i\neq 0} e^{-(M_1(0)-M_1(i))}\right)$$

In Eq. (2), $M_n(i)$ is an ith metric in a descending-order arrangement of metrics $(\log(\alpha_{k-1}(s')\gamma_k(s',s)\beta_k(s)))$ for an information symbol n (0 or 1) in the state set (s, s') at time k. Therefore, $M_0(0)$ and $M_1(0)$ are the best metrics for the information symbol 1 and 0 at time k, and $f_c$ is a correction value defined by the difference between the best metric and the other metrics for each information symbol. Accordingly, the LLR is updated using the best metric difference between the information symbols 0 and 1 at time k and the correction value $f_c$.

In summary, the Log-MAP algorithm generates all state metrics in a trellis for each constituent decoder by Eq. (1) and computes the LLR of a code symbol in the trellis using its state metrics by Eq. (2). Each constituent decoder feeds extrinsic information derived from the LLR to the other constituent decoder, for iterative decoding. In this manner, turbo decoding is performed.

The Max-Log-MAP algorithm is a simplified version of the Log-MAP algorithm by reducing the state metric computation of Eq. (1) to a maximum operation expressed as $$\log\alpha_k(s) \approx \max_{s'}(\log(\alpha_{k-1}(s')\gamma_k(s', s))) \quad (3)$$

$$\log\beta_{k-1}(s') \approx \max_{s}(\log(\beta_k(s)\gamma_k(s', s)))$$

In the same manner, the LLR of the kth decoding symbol is simply computed by the maximum operation. The LLR is updated using only the best metric difference, assuming $f_c$ to be 0. Thus, $$L(\hat{u}_k) = M_0(0) - M_1(0) \quad (4)$$

In summary, the Max-Log-MAP algorithm searches all state metrics in the trellis for each constituent decoder by the maximum operation of Eq. (3) and computes the LLR of a code symbol in the trellis using the best metric difference between information symbols 0 and 1 by Eq. (4). Extrinsic information derived from the LLR is fed to the other constituent decoder, for iterative decoding. In this manner, turbo decoding is performed.

A so-called Max-Log-MAP algorithm with Feedback Gain (FG) considers an additional gain derived from the LLR computed by Eq. (4) to improve the decoding performance of the Max-Log-MAP algorithm. A weighting factor multiplied as the feedback gain is about 0.588235 and applied only to extrinsic information from a second constituent decoder.

Since the Log-MAP algorithm is the log-domain implementation of an optimum symbol by symbol MAP decoding algorithm, it performs as well as the MAP algorithm. However, when the Log-MAP algorithm is implemented in hardware, the function of $\log(1+e^{-\Delta})$ defining each metric must be implemented in hardware or in the form of a look-up table. The Max-Log-MAP algorithm, on the other hand, requires no look-up table, but performs worse than the Log-MAP algorithm. The benefits and shortcomings of the Log-MAP algorithm and the Max-Log-MAP algorithm are as follows.

(1) The Log-MAP algorithm: Since it is an optimum symbol by symbol decision algorithm, it is the best turbo decoding algorithm. However, the implementation of $\log(1+e^{-\Delta})$ increases hardware complexity. Moreover, $\log(1+e^{-\Delta})$ is a non-linear function and thus an accurate SNR estimate of a received symbol is required to compute branch metrics by which $\Delta$ is defined. If the SNR estimation involves errors, this SNR mismatch degrades performance markedly.

(2) The Max-Log-MAP algorithm: Log( ) computation is not required for metric calculation because all metrics are calculated by the maximum operation. Therefore, the problem of increased hardware complexity as encountered in the Log-MAP algorithm is not produced. Furthermore, the calculation of metrics by the maximum operation obviates the need of the non-linear function $\log(1+e^{-\Delta})$, which implies that there are no SNR mismatch-related problems. However, since the Max-Log-MAP algorithm is an approximation of the Log-MAP algorithm, it performs about 0.3 to 0.4 dB worse than the Log-MAP algorithm.

As described above, the Log-MAP algorithm and the Max-Log-MAP algorithm cause increased hardware complexity and performance degradation as their respective shortcomings.

SUMMARY OF THE INVENTION

It is, therefore, an object of the present invention to provide a turbo decoding apparatus and method which perform better than the Max-Log-MAP algorithm in turbo decoding.

It is another object of the present invention to provide a turbo decoding apparatus and method which is less complex than the Log-MAP algorithm.

The above objects are substantially achieved by a constituent decoder for decoding a turbo code and a constituent decoding method thereof. The best metric and the second best metric are calculated for the value of a received code symbol in an arbitrary state of a turbo decoding trellis during turbo decoding of the code symbol. Extrinsic information necessary for turbo decoding of the code symbol is calculated. The difference between the extrinsic information and a best metric-second best metric difference is calculated. The LLR of the code symbol is updated by multiplying the calculated difference by a predetermined weighting factor and deciding the value of the code symbol.

The extrinsic information is calculated using the difference between the two metrics, an input symbol reflecting an SNR and the a priori information of the input symbol.

The weighting factor is less than 1 and approximate to 1. Preferably, it is greater than 0.588235. Preferably, it is $1/2+1/4+1/16$.

If the SNR can be perfectly estimated, the weighting factor is calculated using a log function. If the SNR cannot be perfectly estimated, the weighting factor is calculated using an approximated linear function.

In the constituent decoder for decoding a turbo code, a first adder for calculating the LLR of a received code symbol by calculating the difference between the probability of the code symbol being 1 and the probability of the code symbol being 0 at an arbitrary state of a turbo decoding trellis during turbo decoding of the code symbol. A second adder adds the transmission information and a priori information of the code symbol. A third adder calculates the difference between the outputs of the first and second adders as extrinsic information. A first multiplier multiplies the output of the third adder by a predetermined weighting factor as a feedback gain. A correction value calculator calculates a correction value using the difference between the best metric and the second best metric of the code symbol. A fourth adder adds the correction value to the output of the first multiplier.

The correction value calculator includes a fifth adder for calculating the difference between the best metric and the second best metric for an information symbol 0 as the value of the code symbol, a sixth adder for calculating the difference between the best metric and the second best metric for an information symbol 1 as the value of the code symbol, and a look-up table for storing log function-based correction values for the outputs of the fifth and sixth adders and outputting correction values for the outputs of the fifth and sixth adders. The correction value calculator further includes a seventh adder for calculating the difference between the correction values, a second multiplier for multiplying the output of the seventh adder by a predetermined weighting factor, an eighth adder for calculating the difference between the outputs of the fifth and sixth adders, a third multiplier for multiplying the output of the eighth adder by the inclination of a linear function approximated from the log function, and a selector for selecting one of the outputs of the second and third multipliers according to the reliability of the SNR of the code symbol.

The weighting factor is preferably $1/2+1/4+1/16$.

The SNR reliability is determined according to whether perfect SNR estimation is possible or not. The selector outputs the value received from the second multiplier if the perfect SNR estimation is possible, and the value received from the third multiplier if the perfect SNR estimation is impossible.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Embodiments of the present invention will be described herein below with reference to the accompanying drawings. In the following description, well-known functions or constructions are omitted for conciseness.

The present invention is intended to provide an improved Max-Log-MAP algorithm which, by modifying the LLR updating of the existing Max-Log-MAP algorithm, performs only about 0.1 dB or less worse than the Log-MAP algorithm and offers better turbo decoding performance than the Max-Log-MAP algorithm and the Max-Log-MAP algorithm with FG. Since the improved Max-Log-MAP algorithm is basically a turbo decoding algorithm based on the Max-Log-MAP algorithm, it advantageously provides a slight hardware complexity increase with no SNR mismatch.

The features of the present invention are presented briefly as follows.

(1) For LLR update at an arbitrary decoding time, the second best metrics for information symbols 0 and 1 as well as the best metrics are considered. Notably, the second best metrics are excluded from consideration for LLR updating in the existing Max-Log-MAP algorithm. It will be apparent from later-described simulation results that this LLR update of the present invention leads to turbo decoding performance as good as the Log-MAP algorithm.

(2) If a correction value $f_c$, which is computed using the second best metrics for information symbols 0 and 1 at an arbitrary decoding time, is defined to be a non-linear function, SNR mismatch leads to performance changes. Therefore, $f_c$ is approximated to a linear function. The simulation results will also clarify that the approximation of $f_c$ to the linear function results in excellent turbo decoding performance irrespective of the SNR mismatch.

Hence, linear approximation of $f_c$ will be described according to the present invention. In addition, turbo decoding performance is evaluated in the case where $f_c$ is defined as its original log function and the applicability of this $f_c$ definition is investigated.

Figure 1:
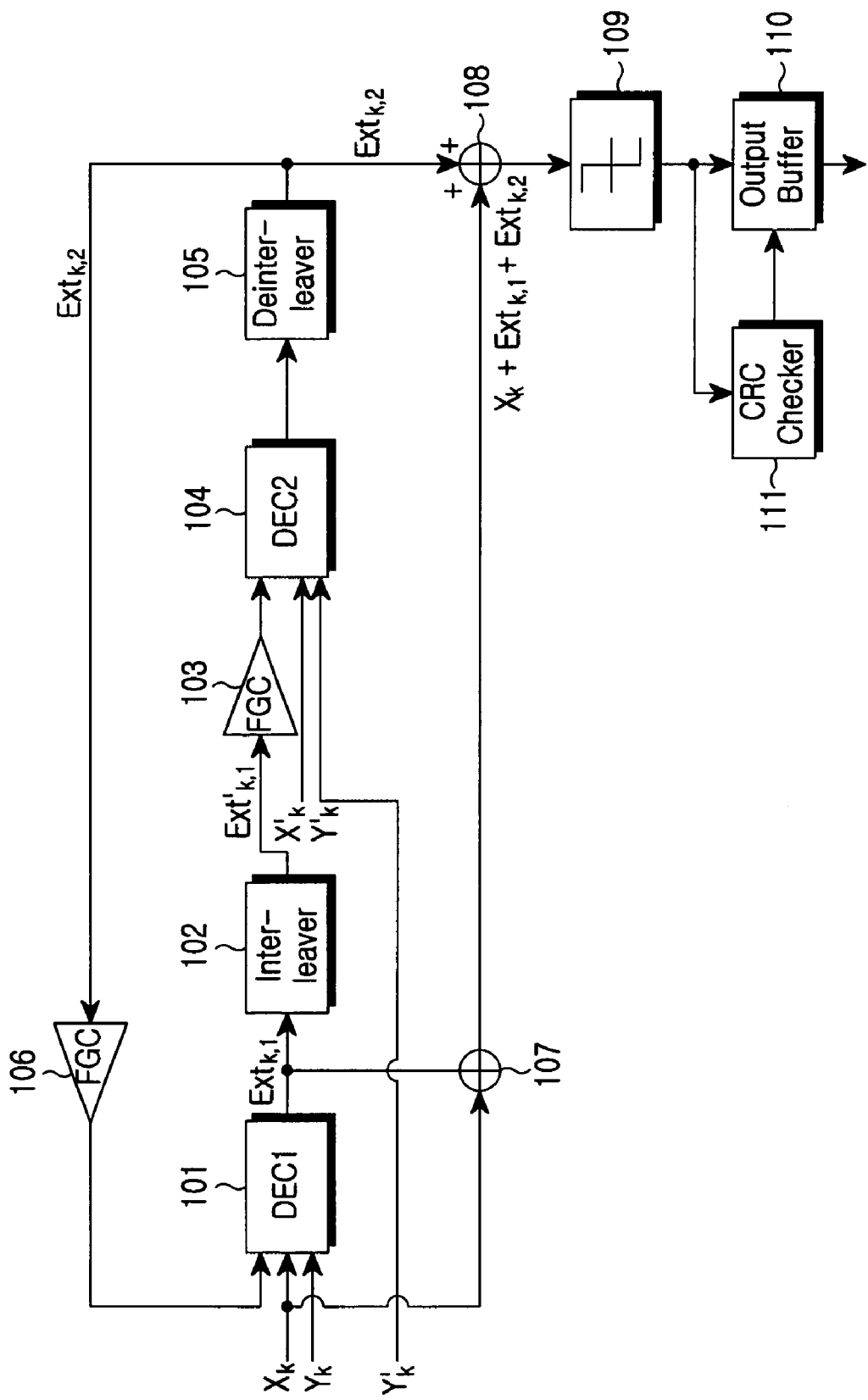
FIG. 1 is a block diagram illustrating an example of a turbo decoder using a modified Max-Log-MAP algorithm according to an embodiment of the present invention.

FIG. 1 is a block diagram illustrating an example of a turbo decoder using a modified Max-Log-MAP algorithm according to an embodiment of the present invention. As described above, the modified Max-Log-MAP algorithm refers to a Max-Log-MAP algorithm that updates an LLR using the best and second best metrics for an information symbol at a decoding time according to an embodiment of the present invention.

The modified Max-Log-MAP algorithm is applied to each constituent decoder (DEC1 and DEC2). An Feedback Gain Controller (FEC) for weighting extrinsic information is also applied to each constituent decoder.

Referring to FIG. 1, first and second constituent decoders (DEC1 and DEC2) 101 and 104, respectively, derive extrinsic information and LLR for an information symbol using the modified Max-Log-MAP algorithm. That is, the constituent decoders 101 and 104 each correspond to one of the constituent encoders of a turbo encoder. An interleaver 102 interleaves a signal received from the first constituent decoder 101. By considering the interleaving of data between the constituent codes of a turbo code, the interleaver 102 permutes the sequence of data so that the output of the first constituent decoder 101 matches the input of the second constituent decoder 104. A first FGC 103 multiplies the interleaved signal by a weighting factor derived from extrinsic information computed in the first constituent decoder 101 in accordance with the modified Max-Log-MAP algorithm. The weighting factor is an empirical value. It is larger in the Max-Log-MAP algorithm than in the Log-MAP algorithm. Considering this, extrinsic information for an information symbol is multiplied by a weighting factor less than 1, thereby achieving better performance. The second constituent decoder 104 decodes the output of the first FGC 103. A deinterleaver 105 performs de-interleaving so that the output of the second constituent decoder 104 matches the input of the first constituent decoder 101. A second FGC 106 multiplies the deinterleaved signal by a weighting factor derived from extrinsic information computed in the second constituent decoder 101 in accordance with the modified Max-Log-MAP algorithm. The output of the second FGC 106 is applied to the input of the first constituent decoder 101.

Adders 107 and 108 add the transmission reliability and a priori probability (APP) of a received code symbol to generate an LLR for an information symbol using the extrinsic information derived from the second constituent decoder 105. The a priori information is the LLR of the probability of an information symbol being 0 to the probability of the information symbol being 1. In a general coding theory, the information symbols 0 and 1 are equiprobable. Therefore, initial a priori information is always 0. As iterative decoding proceeds, extrinsic information from each constituent decoder is used as the a priori information of an information symbol for the other constituent decoder. Hence, the a priori information is not 0 any longer. A decider 109 decides the sign of the LLR. If the LLR sign is positive, the decider 109 generates an information symbol 0, and if the LLR sign is negative, it generates an information symbol 1. The decision value is fed to both an output buffer 110 and a CRC checker 111. In an embodiment of the present invention, the output buffer 110 can be a memory for storing the decision value 0 or 1. The CRC checker 111 checks a prior inserted CRC to detect errors in a frame of decoded information symbols.

The implementation of the modified Max-Log-MAP algorithm in the constituent decoders will now be described below.

The modified Max-Log-MAP algorithm evolved from the Max-Log-MAP algorithm by modifying its LLR updating process. Hence, for implementation simplicity and maintaining the insensitivity of turbo decoding to SNR mismatch, Eq. (3) is still adopted to compute state metrics α and β for the second modified Max-Log-MAP algorithm. Also, Eq. (2) is used with the correction value $f_c$ approximated in order to define the LLR for the modified Max-Log-MAP algorithm.

The approximation of $f_c$ involves defining $f_c$ using the best metrics $M_n(0)$ and second best metrics $M_n(1)$ for information symbols 0 and 1 among all metrics $M_n(i)$ constituting $f_c$ in Eq. (2). In other words, the turbo decoding algorithm of the present invention updates an LLR at an arbitrary decoding time, considering the second best metrics for the information symbols 0 and 1, which are excluded in the LLR updating of the Max-Log-MAP algorithm, as well as their best metrics.

For LLR updating in the modified Max-Log-MAP algorithm, $f_c$ is approximated as $$f_c \approx \log(1+e^{-(M_0(0)-M_0(1))}) - \log(1+e^{-(M_1(0)-M_1(1))}) \quad (5)$$

As noted from Eq. (5), $f_c$ is defined using the best metric $M_n(0)$ and second best metric $M_n(1)$ for an information symbol n at a decoding time. Metrics $M_n(i)$ (i>1) less than the second best metric $M_n(1)$ are discarded in the approximation because they have a negligibly insignificant impact on $f_c$. While the Max-Log-MAP algorithm searches all state sets (s', s) on a trellis at an arbitrary decoding time and computes the best metric $M_n(0)$ for the information symbol, updating metrics for each state set, the modified Max-Log-MAP algorithm computes the second best metric $M_n(1)$ in addition to the best metric $M_n(0)$, and that simultaneously not to increase decoding time. For this purpose, let a metric for a state s be m(s). Then $M_n(0)$ and $M_n(1)$ are computed simultaneously in the manner illustrated in Table 1.

TABLE 1

(1) initialization: s=0, $M_n(0)$=MIN, $M_n(1)$=MIN
(2) find m(s)
(3) if $M_n(0)$<m(s), $M_n(1)$= $M_n(0)$ and $M_n(0)$=m(s)
    else if $M_n(1)$<m(s), $M_n(1)$=m(s)
(4) if s=S-1, stop. Else go to (5)
(5) increase s by 1. Go to (2)

In Table 1, MIN is a very small value equivalent to −∞, for state metric initialization and S is the total number of states in the trellis of constituent convolutional codes.

Figure 2:
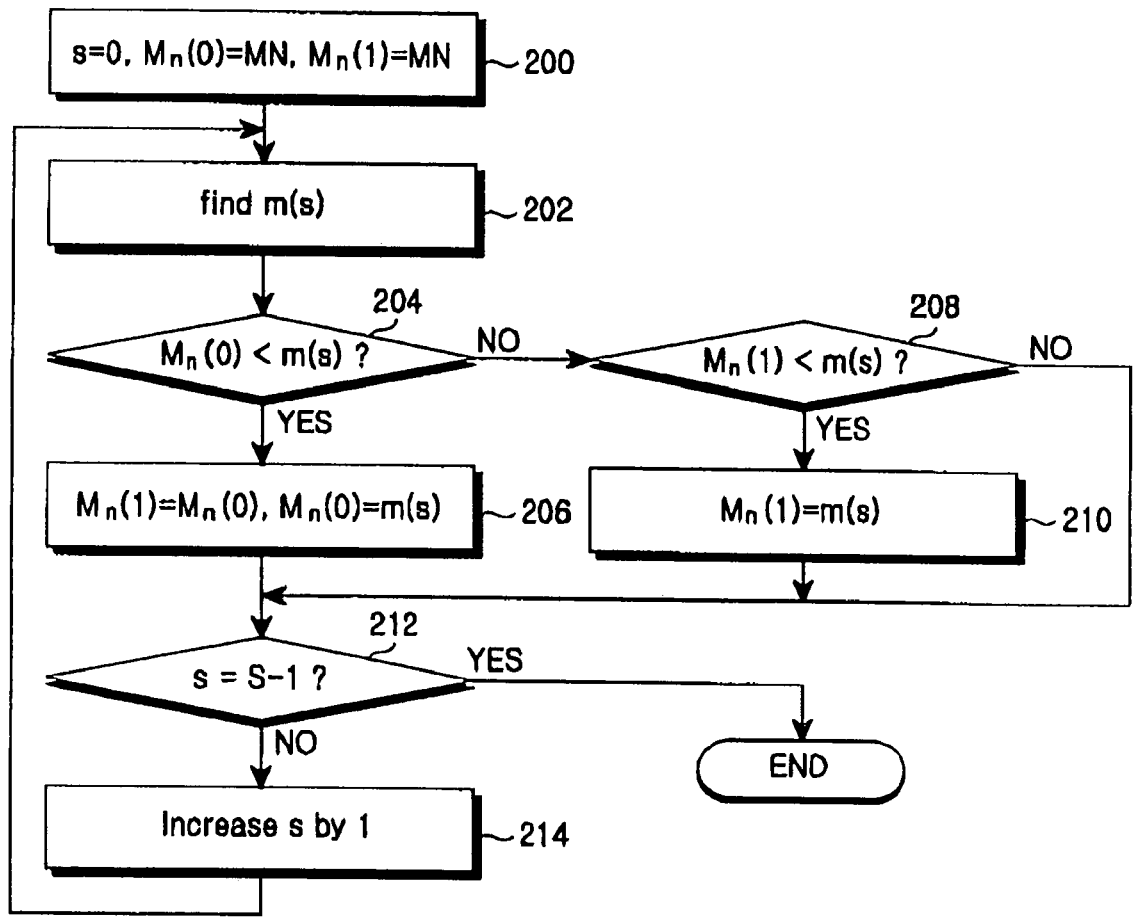
FIG. 2 is a flowchart illustrating an example of operations for finding the best metric $M_n(0)$ and second best metric $M_n(1)$ at decoding time k according to an embodiment of the present invention.

FIG. 2 is a flowchart illustrating an example of operations for computing the best metric $M_n(0)$ and second best metric $M_n(1)$ at decoding time k according to an embodiment of the present invention.

Referring to FIG. 2, the trellis state and the best and second best metrics for information symbols 0 and 1 are set to initial values at decoding time k in step 200 as indicated by (1) in Table 1. In step 202, a metric for an information symbol n (0 or 1) is computed, increasing the state by 1 each time. Hence, the operation of FIG. 2 is a process of finding the current state s. The computed metric is compared with the existing best metric for the information symbol n in step 204. If the current metric is greater than the existing best metric, the procedure goes to step 206. Otherwise, it goes to step 208. In step 206, the current metric is set as the best metric and the existing best metric is set as the second best metric.

On the other hand, in step 208, the current metric is compared with the existing second best metric. If the current metric is greater than the existing second best metric, the second best metric is updated to the current metric in step 210. If the current metric is equal to or less than the existing second best metric in step 206 or 210, or step 208, the procedure goes to step 212.

In step 212, it is determined whether the current state is the last state. If it is, the procedure ends. If it is not, the state is increased by 1 in step 214.

In this manner, the best and second best metrics $M_n(0)$ and $M_n(1)$ are obtained at the same time at an arbitrary decoding time. Using these metrics, the correction value $f_c$ is approximated as Eq. (5).

However, the non-linear approximation of $f_c$ in Eq. (5) affects decoding performance according to the absolute value of an input symbol in the turbo decoder. That is, a receiver cannot estimate an accurate SNR, resulting in SNR mismatch. As a result, if a decoder input symbol is changed, the turbo decoding performance is also changed. Therefore, it is necessary to approximate $f_c$ from the log function to a linear function.

A description will now be made of an approximation of the log function compared to a linear function.

With a representation of $f_c$ by the log function as in the Log-MAP algorithm, or by a look-up table corresponding to the log function, the SNR mismatch changes $E_s/N_o$ which is multiplied by a decoder input symbol despite a constant SNR for the input symbol, which remarkably changes turbo decoding performance. To maintain the decoding performance irrespective of the value of the input symbol, the log function must be modified. Eq. (6) renders an approximation to the log function.

$$l(x)=\log(1+e^{-x})\approx -Kx+c \quad x>0,\ K>0,\ c>0 \quad (6)$$

A function having a metric as a factor must be linear with respect to the metric, to achieve an LLR in the manner that renders decoding performance irrespective of the change of an input symbol. If $f_c$ changes in a non-linear manner depending on the metric varying with the input symbol value, $f_c$ also non-linearly changes with respect to the LLR according to the variable input symbol despite the same SNR. Therefore, a constant performance is not ensured.

In the approximation expressed as Eq. (6), a constant c is negligible. It is offset by approximating 1(x) as a first-order function with the constant c because $f_c$ is defined by the difference between functions 1(x) having metrics for information symbols 0 and 1 as their factors.

This approximation is rough. Due to errors caused by the rough approximation, the modified Max-Log-MAP algorithm of the present invention performs worse than a modified Max-Log-MAP algorithm with 1(x) defined as a log function. However, defining 1(x) as the non-linear function may lead to good performance if perfect SNR estimation is ensured, but the decoding performance is changed when SNR mismatch changes the input symbol value.

Through the approximation, the LLR is updated in the modified Max-Log-MAP algorithm by $$L(\hat{u}_k)=M_0(0)-M_1(0)+f_c$$

where $$f_c=-K(M_0(0)-M_0(1))+K(M_1(0)-M_1(1)) \quad (7)$$

The second best metric $M_n(1)$ is computed at the same time as the best metric $M_n(0)$ by Eq. (7) in the approximation algorithm.

Now, weighting factors applied to extrinsic information will be described. Extrinsic information about an information symbol can be achieved using an LLR from the LLR updating process of the modified Max-Log-MAP algorithm.

Since the Max-Log-MAP algorithm produces extrinsic information through repeated approximation, the extrinsic information has a relatively large value compared to extrinsic information in the Log-MAP algorithm. To reduce this impact, extrinsic information for the information symbol is multiplied by a weighting factor. In the conventional Max-Log-MAP algorithm with FG, a predetermined weighting factor, for example, 0.588235 is multiplied by extrinsic information from the second constituent decoder for each iteration. However, in the modified Max-Log-MAP algorithm, the correction value $f_c$ reflecting the second best metric is involved in the LLR and thus a weighting factor for extrinsic information must be nearer to 1 than $f_c$. Considering a weighting factor $W_f$, the extrinsic information is formed as $$Le(u_k) = W_f((M_0(0) - M_1(0) + f_c) - L_c y_k + La(\hat{u}_k)) \qquad (8)$$
$$= W_f((M_0(0) - M_1(0)) - (L_c y_k + La(\hat{u}_k))) + f_c'$$

where $$f_c' = W_f(\log(1 + e^{-(M_0(0) - M_0(1))}) - \log(1 + e^{-(M_1(0) - M_1(1))}))$$

or $$f_c' = -K'(M_0(0) - M_0(1)) + K'(M_1(0) - M_1(1))$$

In Eq. (8), $K' = K \cdot W_f \cdot L_c y_k$ is a signal reflecting a channel reliability at the input of the turbo decoder and $La(\hat{\mu}_k)$ is the a priori information of the current information symbol. The formula is produced by subtracting extrinsic information from the difference between the best metric and the second best metric and then adding a new correction value $f_c'$ to the resulting difference. Hereinafter, $f_c'$ is called a correction value.

The following description is made of defining an LLR and extrinsic information for iterative decoding in the modified Max-Log-MAP algorithm.

Figure 3:
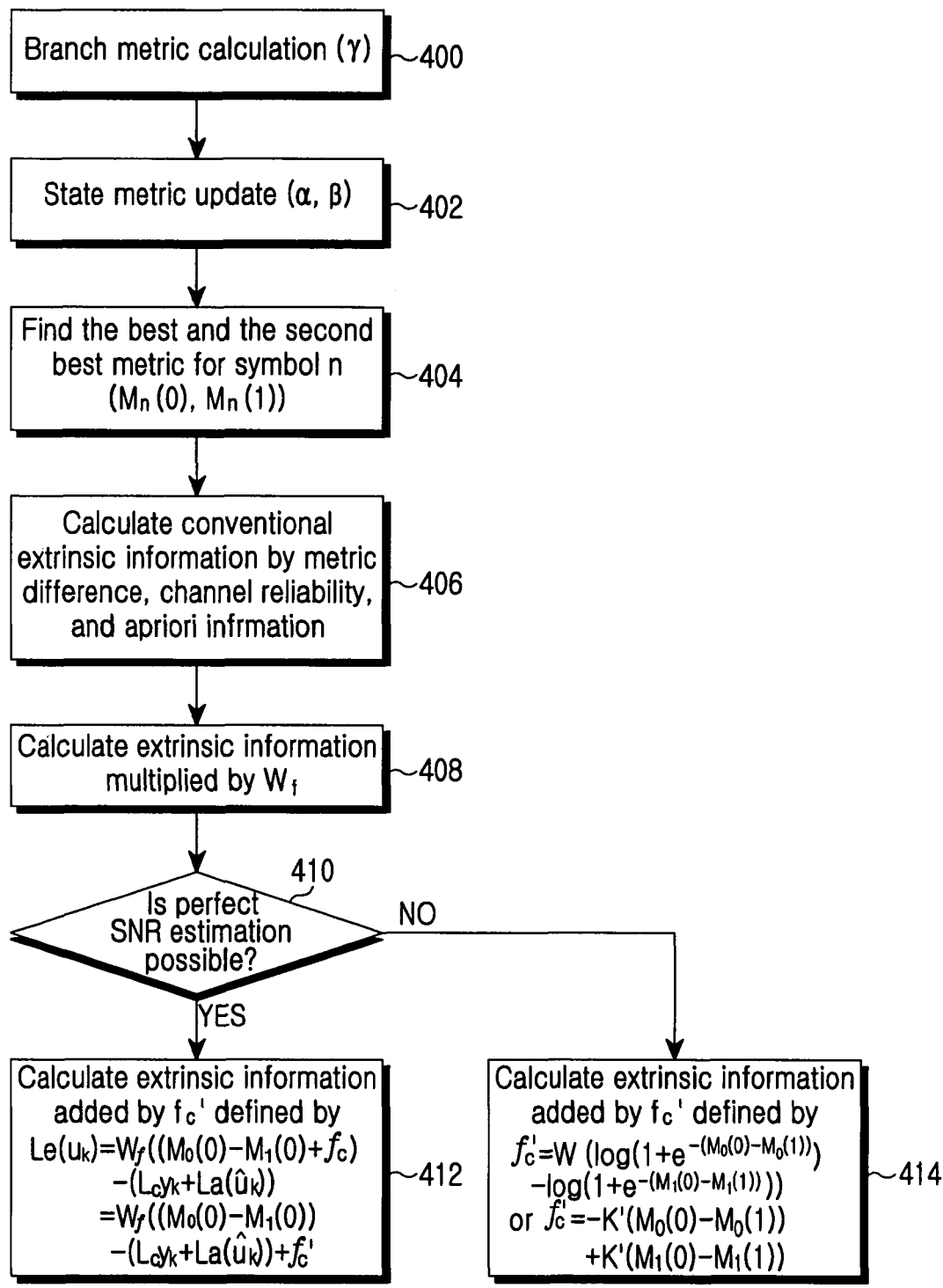
FIG. 3 is a flowchart illustrating an example of operations for computing an LLR and extrinsic information for iterative decoding in the modified Max-Log-MAP algorithm according to an embodiment of the present invention.

FIG. 3 is a flowchart illustrating an example of operations for computing the LLR for an information symbol and extrinsic information used for iterative decoding in the modified Max-Log-MAP algorithm according to an embodiment of the present invention.

Referring to FIG. 3, a branch metric γ is calculated for an arbitrary state transition in a trellis in step 400 and state metrics α and β are updated for all state sets (s, s') in relation to the state transition in step 402. In step 404, the best metric $M_n(0)$ and the second best metric $M_n(1)$ are found at the same time to achieve the LLR in the procedure of FIG. 2, updating the state metrics. The LLR is computed using the difference between $M_n(0)$ and $M_n(1)$, the decoder input with an SNR considered therein, and the a priori information of an information symbol by Eq. (8) in step 406. This step is performed in function blocks 601, 602 and 603 illustrated in FIG. 5. In step 408, the extrinsic information is multiplied by a weighting factor $W_f$, which is performed in a function block 604 illustrated in FIG. 5.

The correction value $f_c'$ is chosen as one of two values defined in Eq. (8) depending on whether the log function is approximated to a linear function or not. If the receiver can perform perfect SNR estimation, $f_c'$ is chosen as the original log function. Otherwise, it is chosen as the approximated linear function. Thus, if the perfect SNR estimation is possible in step 410, the procedure goes to step 412 and if it is impossible, the procedure goes to step 414. In step 414, the log function is used as $f_c'$ and in step 412, the linear function is used as $f_c'$. The log function is chosen when function blocks 701, 702, 703, 705 and 707 illustrated in FIG. 6 output FLAG as 0, while the linear function is chosen when function blocks 701, 702, 704, 706 and 708 illustrated in FIG. 6 output FLAG as 1.

Figure 4:
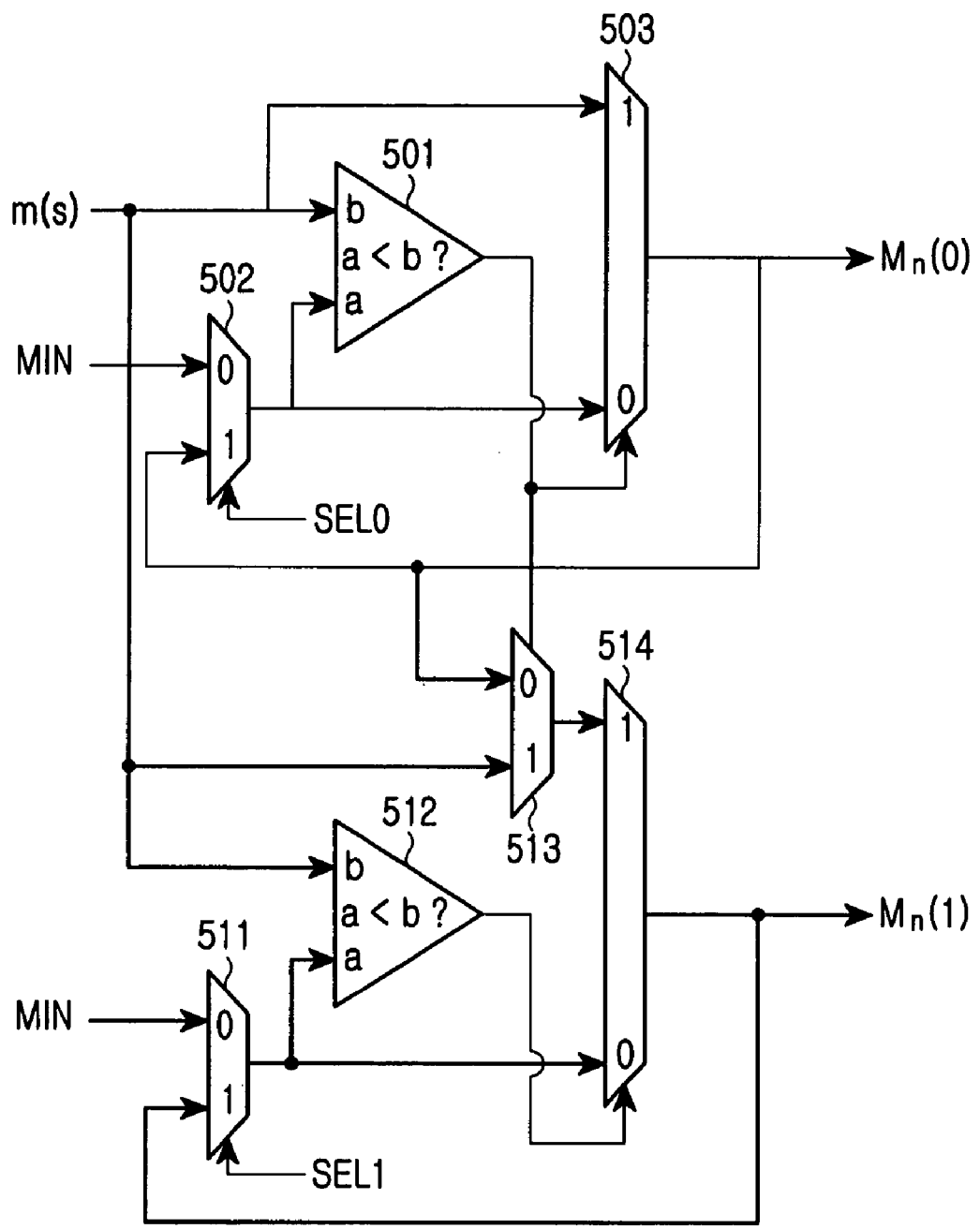
FIG. 4 is a block diagram of an example of function blocks for simultaneously finding the best and second best metrics for the LLR at an arbitrary decoding time according to an embodiment of the present invention.

FIG. 4 is a block diagram of an example of function blocks for finding the best metric and the second best metric in relation to an LLR at an arbitrary decoding time according to an embodiment of the present invention.

Referring to FIG. 4, a bold solid line denotes a second best metric finding section, that is, function blocks 511 to 514. Therefore, the other function blocks 501, 502 and 503 operate according to the Max-Log-MAP algorithm. These function blocks update metrics for all trellis states, increasing the index of a state by 1 each time. Here, a signal SEL0 is 0 for the first state and 1 for the following states. A signal SEL1 is 0 for the first and second states and 1 for the following states.

The function blocks 502, 503, 511, 513 and 514 are selectors for outputting the input at port 0 if a select signal is 0 and the input at port 1 if the select signal is 1. The function blocks 501 and 512 are selectors for outputting 1 if a signal at port a is less than a signal at port b, and 0 if the signal at port a is equal to or greater than the signal at port b.

Figure 5:
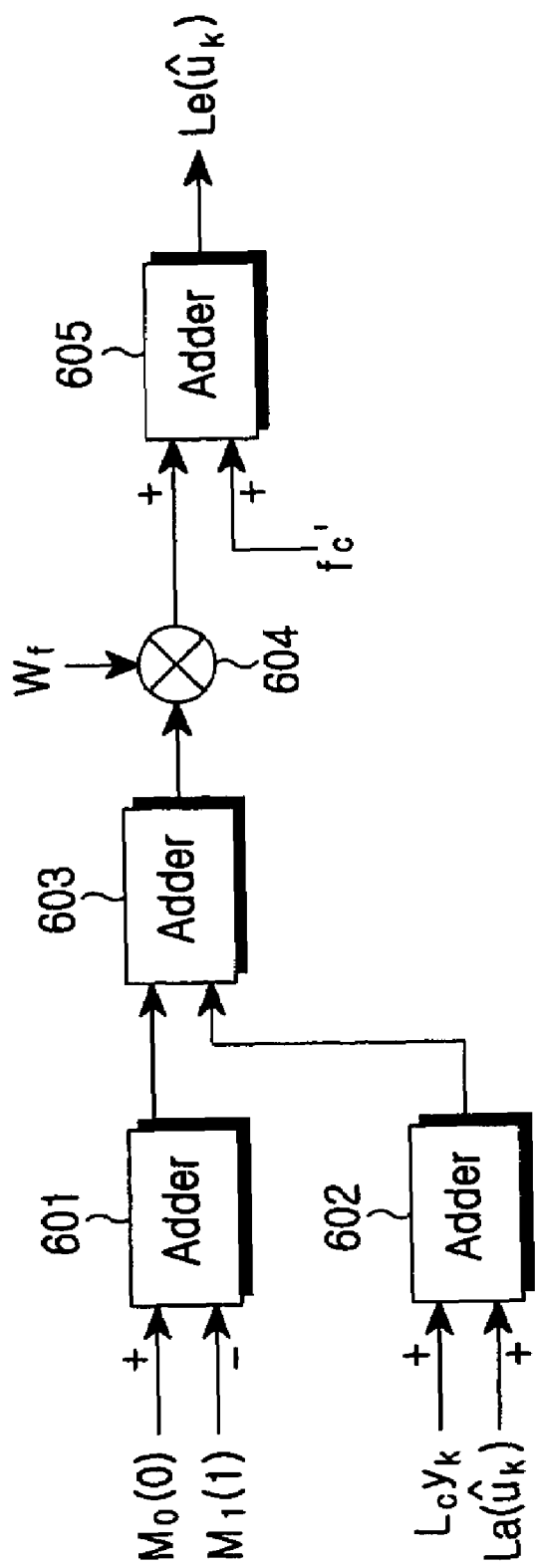
FIG. 5 is a block diagram of an example of function blocks for producing extrinsic information for an information symbol at an arbitrary decoding time according to an embodiment of the present invention.

FIG. 5 is a block diagram of an example of function blocks for generating extrinsic information about an information symbol at an arbitrary decoding time according to an embodiment of the present invention.

Referring to FIG. 5, a first adder 601 outputs the difference between the best metrics for 0 and 1 as LLR information about an information symbol. A second adder 602 adds the transmission information and a priori information of a received symbol. A third adder 603 subtracts the sum received from the second adder 602 from the LLR information received from the first adder 601. The output of the third adder 603 is extrinsic information defined in the existing Max-Log-MAP algorithm. A multiplier 604 multiplies the extrinsic information by a weighting factor, as done in the existing Max-Log-MAP algorithm with FG. If the weighting factor is 1, this effects the Max-Log-MAP algorithm. A fourth adder 605 adds a correction value $f_c'$ obtained by the function blocks illustrated in FIG. 6 to the output of the multiplier 604. Thus, the final extrinsic information for the modified Max-Log-MAP algorithm is achieved.

That is, the extrinsic information is obtained for the modified Max-Log-MAP algorithm by further using the multiplier 604 associated with the weighting factor $W_f$ and the adder 605 associated with the correction value $f_c'$, compared to the Max-Log-MAP algorithm. Also, compared to the Max-Log-MAP algorithm with FG, the adder 605 is further used.

Figure 6:
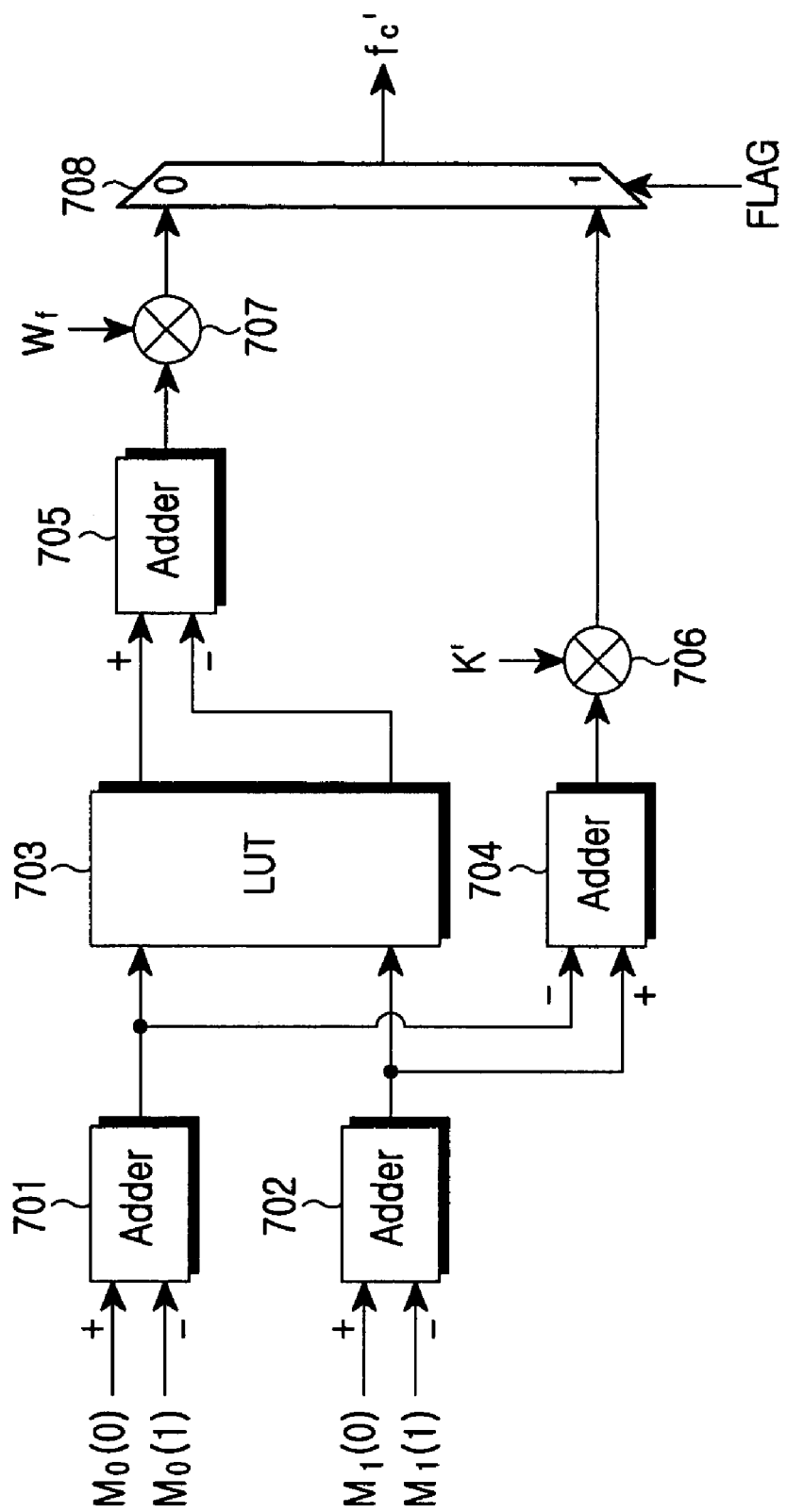
FIG. 6 is a block diagram of an example of function blocks for computing a correction value used to obtain the extrinsic information according to an embodiment of the present invention.

FIG. 6 is a block diagram of an example of function blocks for calculating the correction value $f_c'$ for use in computing the extrinsic information according to an embodiment of the present invention.

Referring to FIG. 6, the first adder 701 computes the difference between the best metric and the second best metric for an information symbol 0 and the second adder 702 computes the difference between the best metric and the second best metric for an information symbol 1. A look-up table (LUT) 703 finds correction values from the log function defined in Eq. (8) using the differences. The third adder 707 computes the difference between the correction values. The first multiplier 707 multiplies the difference by a weighting factor, thereby deciding a final correction value.

The fourth adder 704 computes the difference between the outputs of the first and second adders 701 and 702. The second multiplier 706 multiplies the difference by an inclination value, thereby deciding a correction value approximated to a linear function.

One of the correction values defined in Eq. (8) is chosen according to a signal FLAG. For the choice of the log function, the selector 708 selects the input at port 0. On the contrary, for the choice of the linear function, the selector 708 selects the input at port 1. The former case requires an LUT, whereas the latter case requires simply adders and a multiplier. Notably, when FLAG is 0, perfect SNR estimation must be ensured at the receiver. This structure illustrated in FIG. 6 is further implemented in hardware for the modified Max-Log-MAP algorithm. If the weighting factor $W_f$ and the value K' can be expressed as 2's exponents, the multipliers of FIGS. 5 and 6 can be implemented as simple bit selectors or adders including them.

To evaluate the turbo decoding performance of the modified Max-Log-MAP algorithm according to the present invention, simulations were performed under the following conditions.

All the simulations were floating-point ones and decoding performance was evaluated in terms of Bit Error Rate (BER) and Frame Error Rate (FER). To investigate the impact of SNR mismatch, decoding performance with respect to $E_b/N_o$ offset was also evaluated. A rate ⅕ turbo encoder as provided by CDMA2000 1xEV-DV was used and a Quasi Complementary Turbo Code (QCTC) operation was performed to convert an overall code rate to be a value other than ⅕. Frame size is one of EP sizes as defined in 1xEV-DV spec. A modulation scheme used was BPSK and an AWGN channel was assumed. For turbo decoding, the maximum number of decoding iterations was 8. BER and FER were measured by executing the simulations until 50 frame errors were produced.

The weighting factor $W_f$ and the value K' are empirically defined. Since decoding iterations for turbo decoding is generally a sub-optimal decoding operation, not a maximum likelihood decoding, there is a probability of performance being degraded during the iterative decoding. The SNR mismatch simulation revealed that better performance is achieved for an $E_b/N_o$ offset of about −1 dB than for no $E_b/N_o$ offset. This is because the performance degradation possibly generated during the decoding iterations is offset by the −1 dB erroneous weighting. Thus, the weighting factor $W_f$ is empirically given by $$W_f \approx -1 \text{ dB} = 0.79432 \approx \frac{1}{2} + \frac{1}{4} + \frac{1}{16} \tag{9}$$

By representing $W_f$ as the sum of 2's exponents, multiplication by the weighting factor is implemented easily in hardware.

K' in Eq. (8) is the product of an inclination K in Eq. (4) and the weighting factor $W_f$. K in Eq. (6) is defined as the mean inclination of a tangent line of the function $l(x) = \log(1 + e^{-x})$. Therefore, $$-K = \frac{1}{a} \int_0^a \frac{1}{1 + e^x} dx = \frac{\log(1 + e^{-a}) - \log 2}{a} \tag{10}$$

where a is set to a maximum significant value. If a is larger than about 9, $l(x)$ is less than $10^{-4}$. Thus, for a as 9, K is determined by $$-K = \left. \frac{\log(1 + e^{-a}) - \log 2}{a} \right|_{a=9} = 0.7700 \approx \frac{1}{13} \tag{11}$$

Some simulations reveal that defining −K as Eq. (11) leads to excellent performance. K' in Eq. (11) can also be expressed as $$K' = K \cdot W_f = \frac{1}{16} \tag{12}$$

K' can be simply obtained by bit selection which is a simplified hardware implementation of multiplication.

Figure 7:
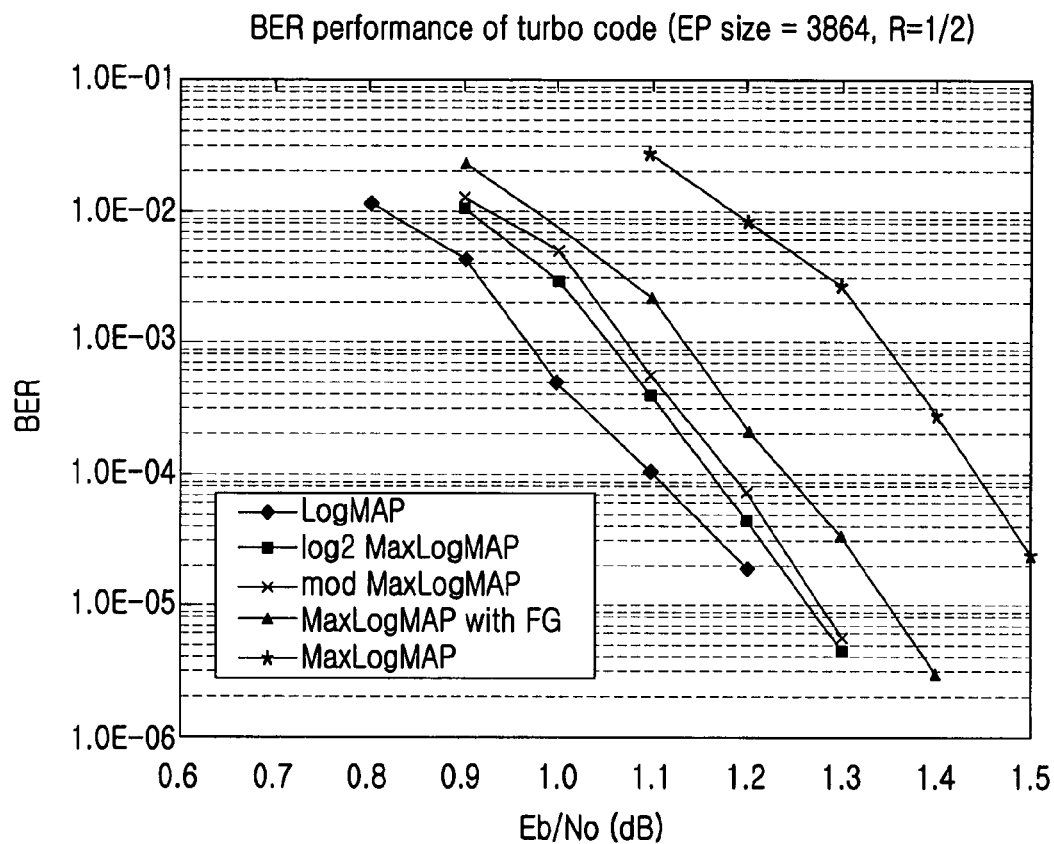
FIGS. 7 and 8 are graphs illustrating examples of Bit Error Rate (BER) and Frame Error Rate (FER) performance of turbo decoding algorithms when an Encode Packet (EP) size is 3864 and an overall code rate is 12 according to an embodiment of the present invention.
Figure 8:
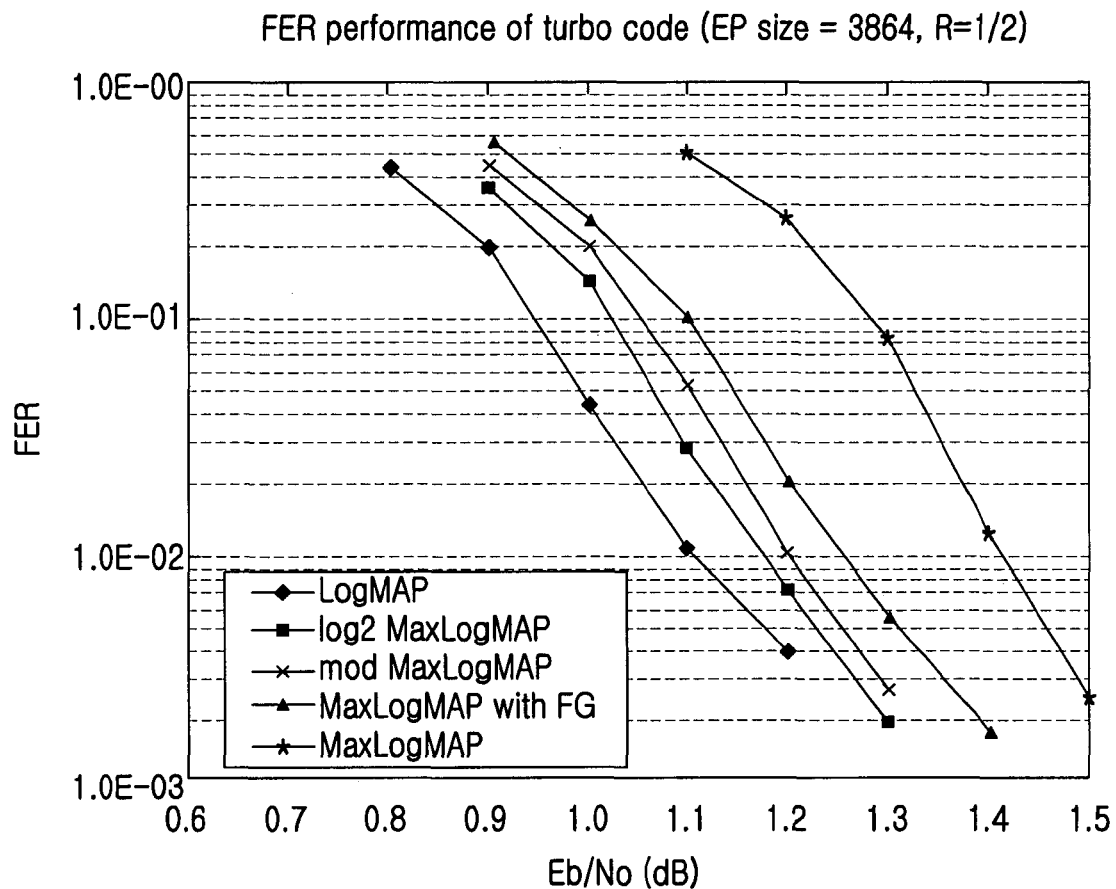

Simulation results from approximation and non-approximation will be compared with reference to FIGS. 7 to 16. FIGS. 7 and 8 illustrate turbo decoding performance in terms of BER and FER for an EP size of 3864 and an overall code rate (R) of ½. In FIGS. 7 and 8, LogMAP denotes the Log-MAP algorithm, log2 MaxLogMAP denotes the Max-Log-MAP algorithm using $f_c$ defined as the log function $l(x)$, mod MaxLogMAP denotes the Max-Log-MAP algorithm using $f_c$ defined as an approximated first-order function, MaxLogMAP with FG denotes the existing Max-Log-MAP algorithm with FG, and MaxLogMAP denotes the existing Max-Log-MAP algorithm. As illustrated, log2 MaxLogMAP is approximate to LogMAP in decoding performance, but this performance is not ensured in case of SNR mismatch. mod MaxLogMAP performs merely about 0.1 dB worse than LogMAP at an FER of $10^{-2}$, while it performs about 0.5 dB better than MaxLogMAP with FG. Mod MaxLogMAP performs constantly irrespective of SNR mismatch.

Figure 9:
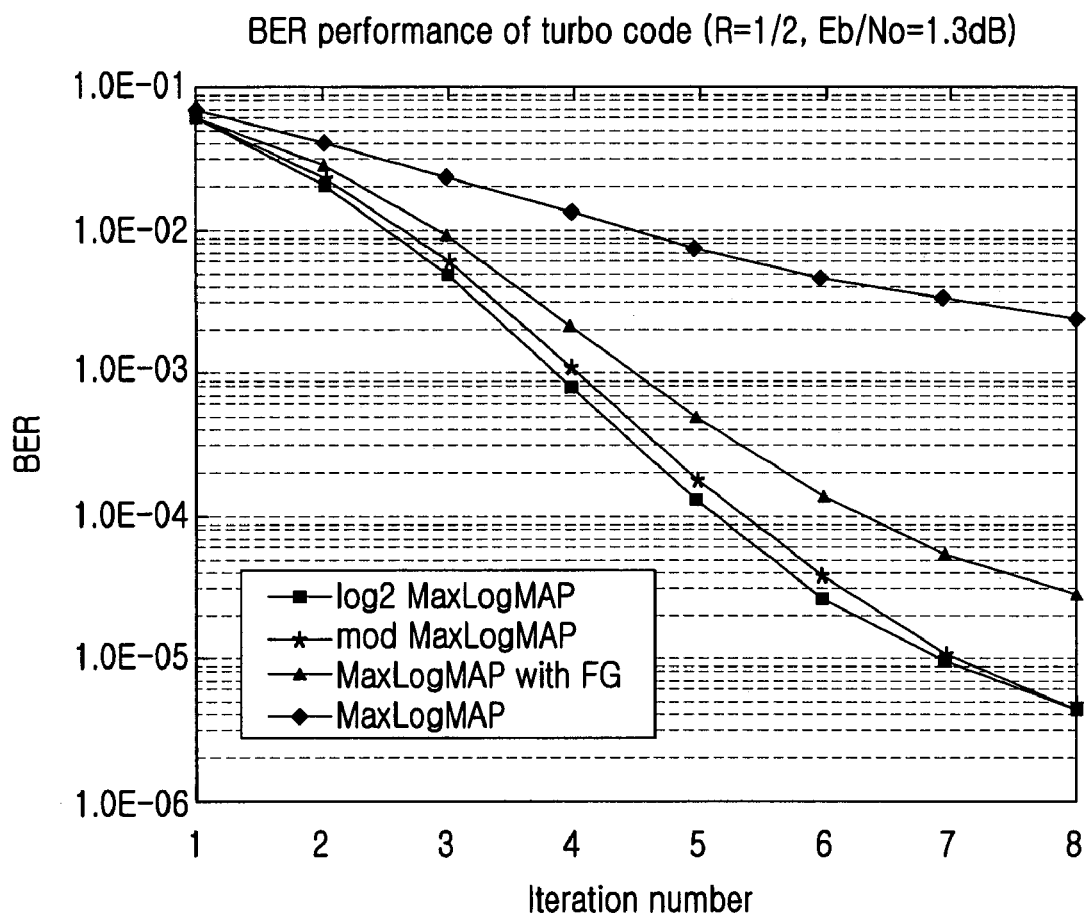
FIGS. 9 and 10 are graphs illustrating examples of BER and FER performance of log2 MaxLogMAP, mod MaxLog-MAP, MaxLogMAP with FG, and MaxLogMAP over iterations at $E_b/N_o$ of 1.3 dB according to an embodiment of the present invention.
Figure 10:
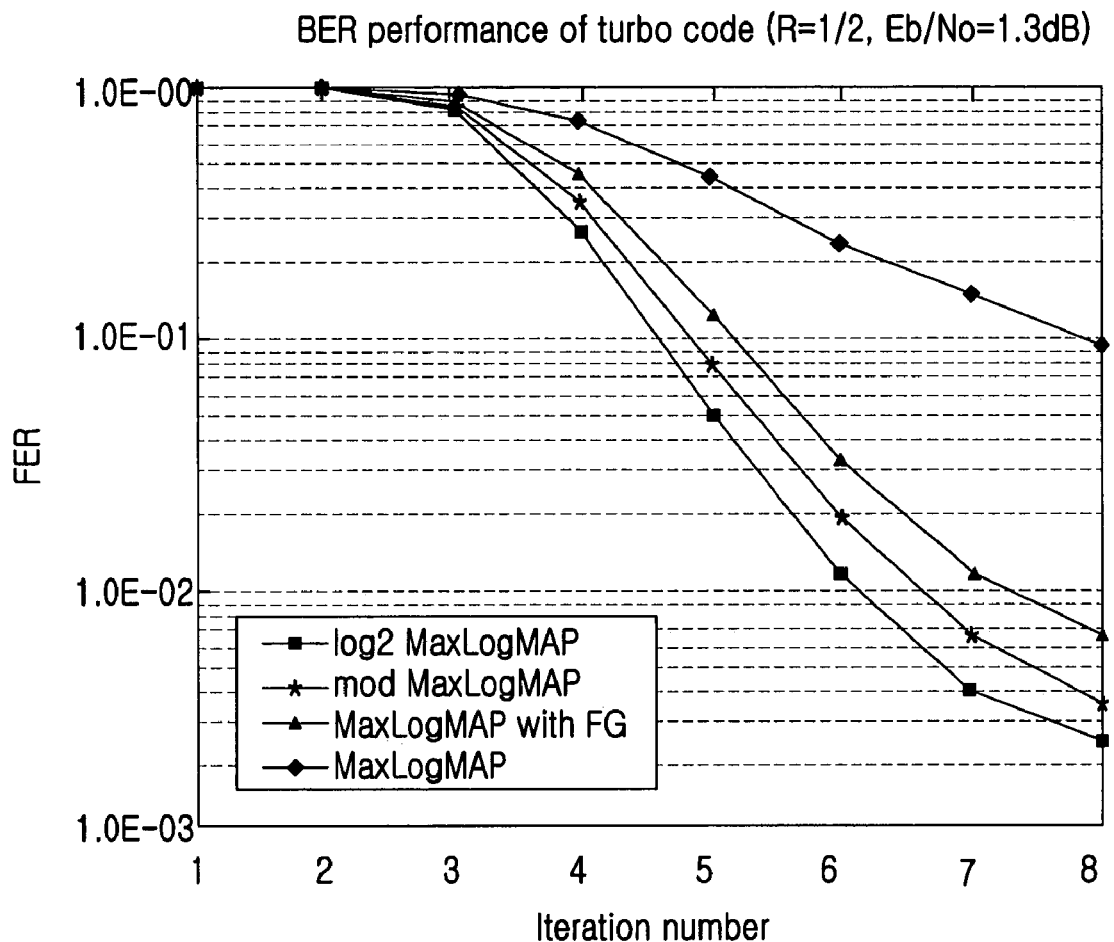

FIGS. 9 and 10 illustrate the BER and FER performances of log2 MaxLogMAP, mod MaxLogMAP, MaxLogMAP with FG, and MaxLogMAP over iterations with $E_b/N_o$=1.3 dB. It is noted from FIGS. 9 and 10 that log2 MaxLogMAP has the best performance over iterations. mod MaxLogMAP does not perform better than MaxLogMAP with FG, but achieves the FER performance of MaxLogMAP with FG over 8 iterations only with 7 iterations.

Figure 11:
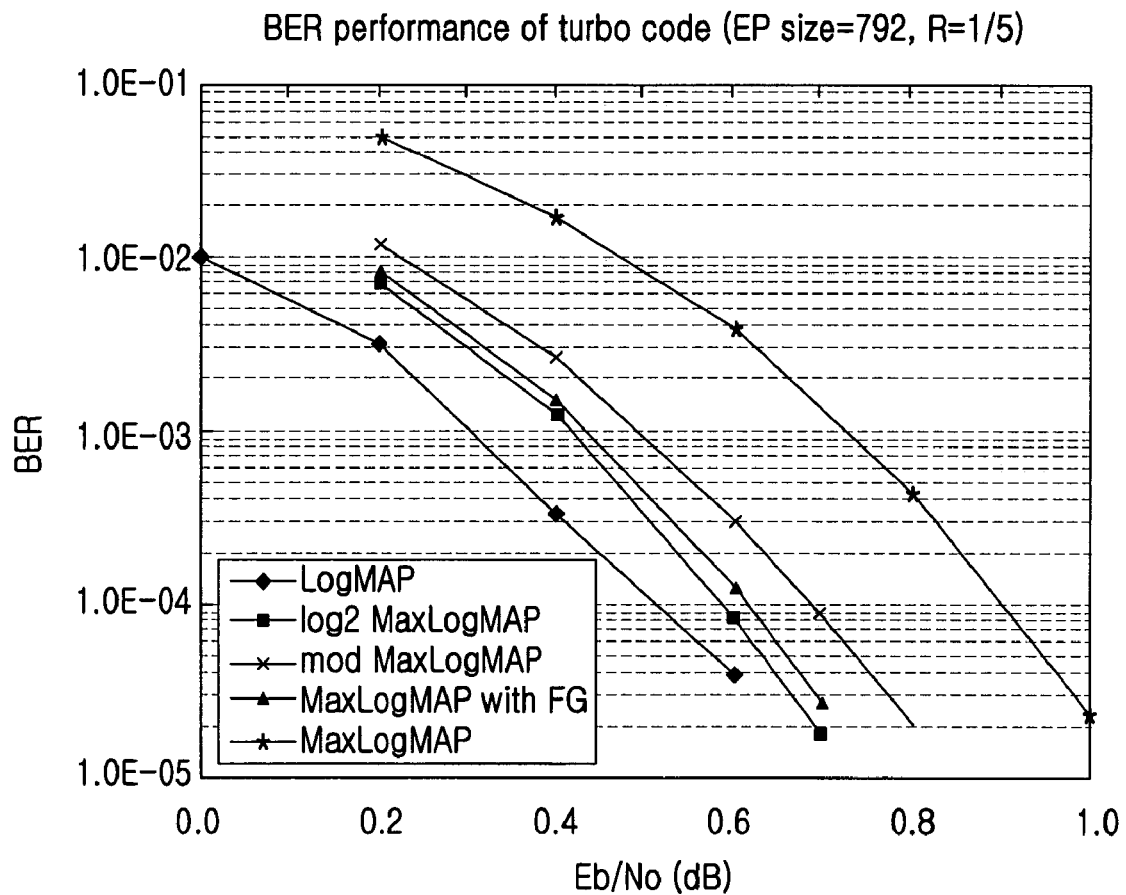
FIGS. 11 and 12 are graphs illustrating examples of BER and FER performance of turbo decoding algorithms when an EP size is 792 and an effective code rate is ⅕ according to an embodiment of the present invention.
Figure 12:
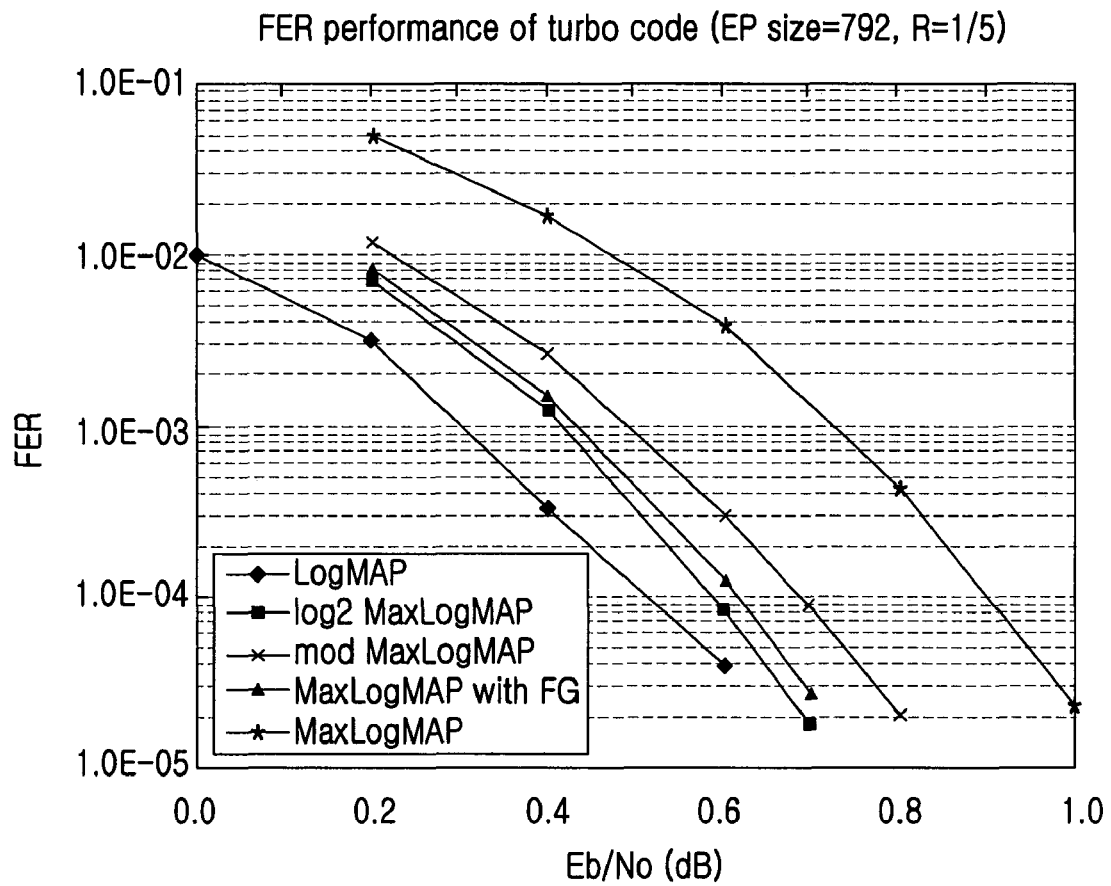

FIGS. 11 and 12 illustrate BER and FER performance for an EP size of 792 and an effective code rate of ⅕. Similarly to the case where the EP size is 3864, there is no change in the performance rankings of the five algorithms. Yet, compared to the case where the EP size is 3864, mod MaxLogMAP performs about 0.1 dB better than MaxLogMAP with FG.

Figure 13:
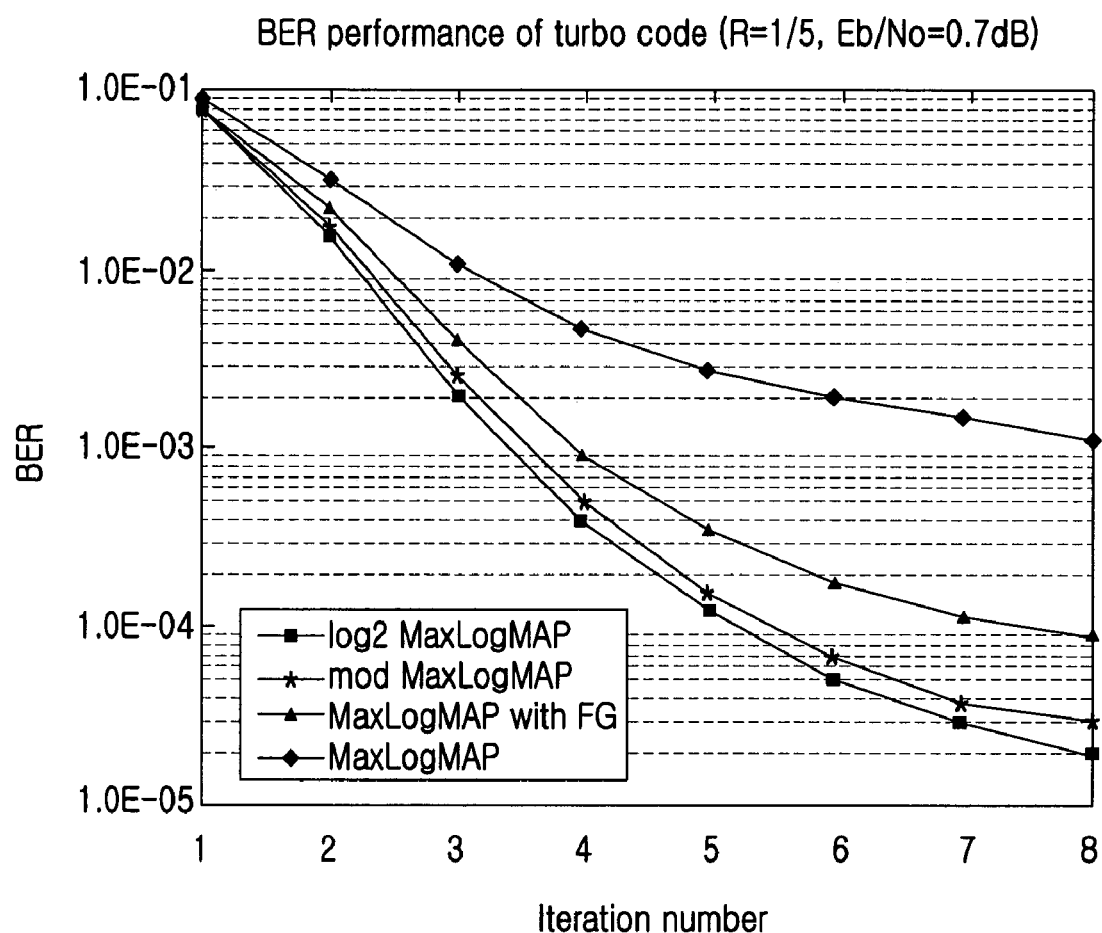
FIGS. 13 and 14 are graphs illustrating examples of BER and FER performance over iterations at $E_b/N_o$ of 0.7 dB when an EP size is 3864 according to an embodiment of the present invention.
Figure 14:
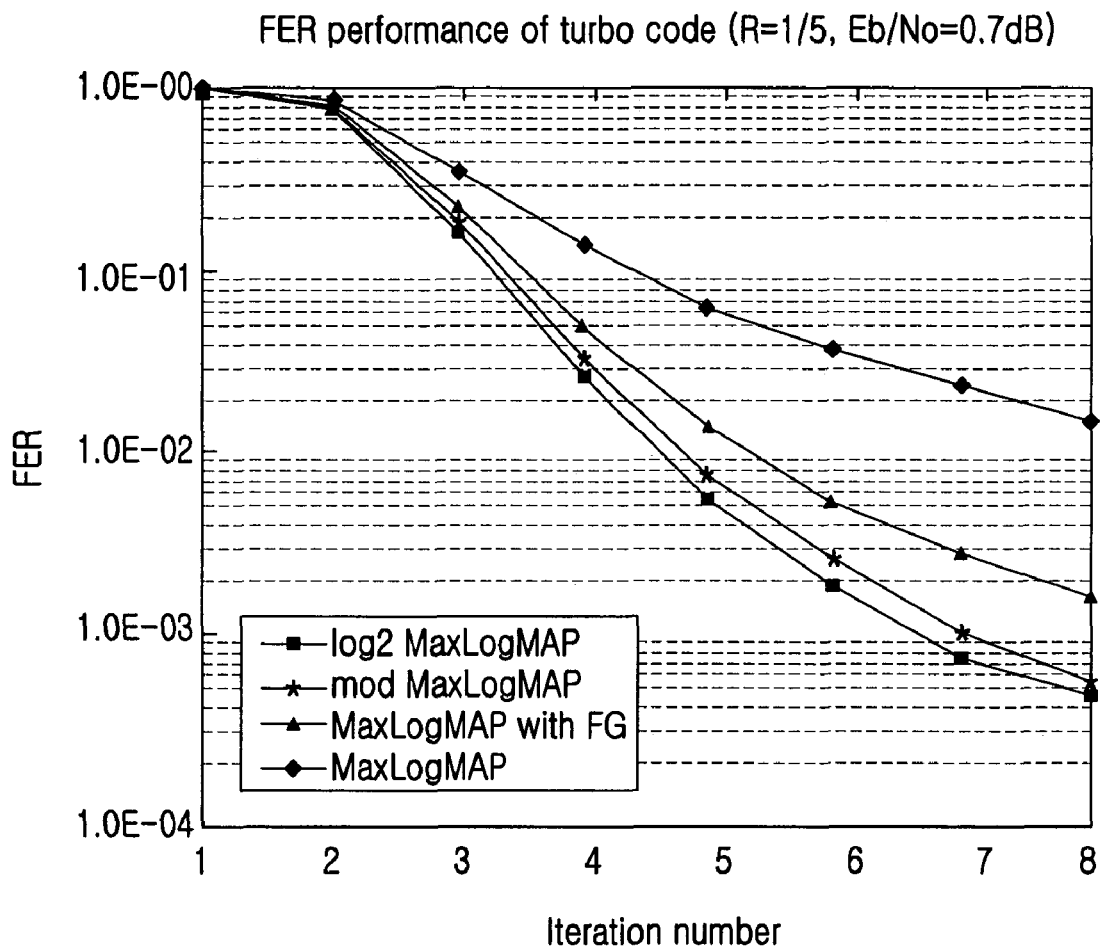
Figure 15:
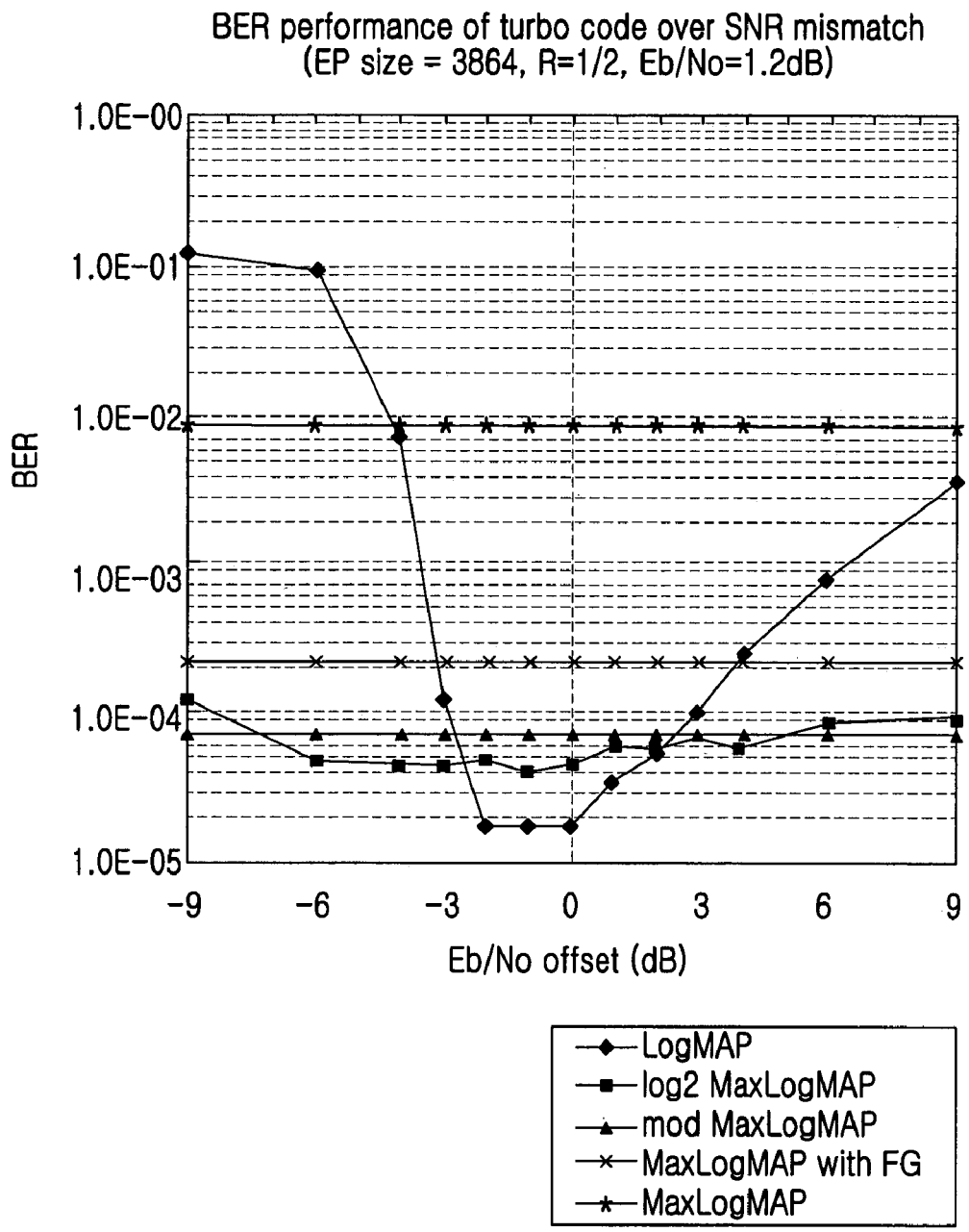
FIGS. 15 and 16 are graphs illustrating examples of BER and FER performance over SNR mismatch at $E_b/N_o$ of 1.2 dB when an EP size is 3864 and an effective code rate is ½ according to an embodiment of the present invention.
Figure 16:
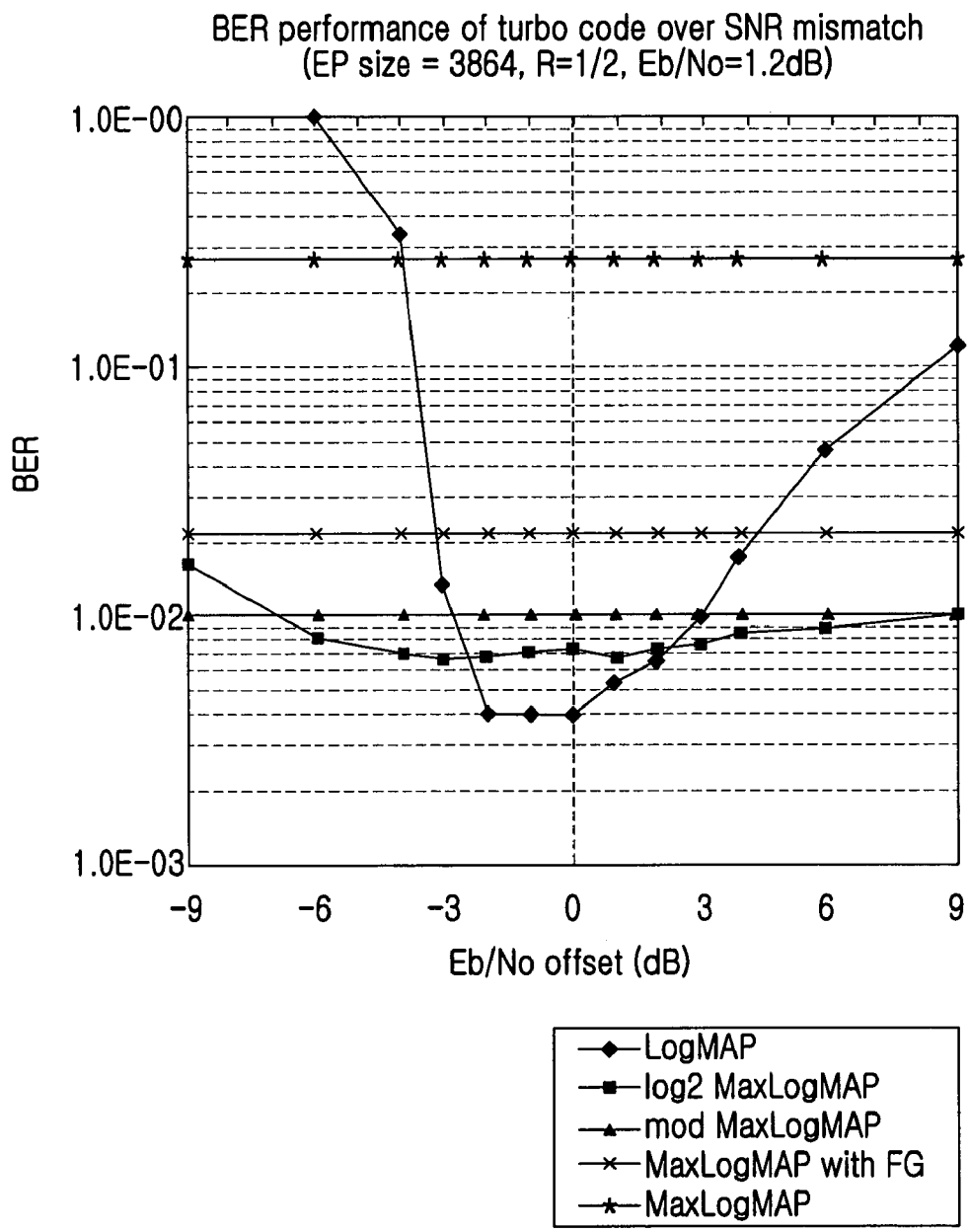

FIGS. 13 and 14 illustrate BER and FER performance of the five algorithms when $E_b/N_o$=0.7 dB and EP size=792, and FIGS. 15 and 16 illustrate BER and FER performance of the five algorithms for EP size=3864, effective code rate=½, and SNR mismatch at $E_b/N_o$ of 1.2 dB, that is, when errors equivalent to an $E_b/N_o$ offset are generated in SNR estimation of a decoder input symbol under the assumption that perfect SNR estimation is achieved when the $E_b/N_o$ offset is 0. As illustrated, mod MaxLogMAP performs irrespective of SNR mismatch because $l(x)$ is approximated to a first-order function. However, log2 MaxLogMAP exhibits a variable performance according to SNR mismatch because $l(x)$ is defined as a non-linear logo function and $f_c$ varies non-linearly depending on the change of a metric in the log ( ) function. Yet, the $f_c$ variation is not large compared to LogMAP. Therefore, as far as an SNR estimation within about −6 dB to +6 dB is guaranteed, log2 MaxLogMAP can be used as a turbo decoding algorithm.

It is noted from the simulations that the modified Max-Log-MAP algorithm performs only about 0.1 dB worse than the Log-MAP algorithm irrespective of EP size, signifying that this performance is better than that of the Max-Log-MAP algorithm (with or without FG). Despite some errors in the SNR estimation of an input symbol, the modified Max-Log-MAP algorithm has excellent performance irrespective of the SNR estimation errors, which is apparent from the simulation results.

As described above, the modified Max-Log-MAP algorithm performs better than the Max-Log-MAP algorithm with small hardware addition as compared to the Max-Log-MAP algorithm and a simplified structure as compared to the Log-MAP algorithm. Therefore, the modified Max-Log-MAP algorithm is applicable to a channel decoder in a mobile terminal for UMTS and HSDPA as well as a channel decoder for a system and terminal of CDMA2000 1xEV-DV. It advantageously performs excellently with a simplified structure.

While the invention has been shown and described with reference to certain embodiments thereof, it will be understood by those skilled in the art that various changes in form and details may be made therein without departing from the spirit and scope of the invention as defined by the appended claims.

What is claimed is:

1. A constituent decoding method for decoding a turbo code, comprising the steps of:
   (1) calculating the best and second best metrics of metrics being the sums of state metrics and a branch metric for a received information symbol in a turbo decoding trellis at an arbitrary time point during turbo decoding of the information symbol;
   (2) calculating the difference between the best metric for the information symbol being 0 and the best metric for the information symbol being 1;
   (3) calculating the difference between the second best metric for the information symbol being 0 and the second best metric for the information symbol being 1;
   (4) calculating the difference between the best metric difference and the second best metric difference and multiplying the calculated difference by a weighting factor, so that the metrics being the sums of the state metrics and the branch metric are linear; and
   (5) updating the log likelihood ratio (LLR) of the information symbol using the best metric difference obtained in the step of (2) and the product obtained in the step of (4) and deciding the value of the information symbol according to the updated LLR.

2. The constituent decoding method of claim 1, further comprising the step of calculating extrinsic information using the updated LLR, an input symbol reflecting SNR (Signal to Noise Ratio), and the a priori information of the input symbol after the step of (5).

3. The constituent decoding method of claim 1, wherein the weighting factor is derived from a function linearized from a log function using the mean inclination of tangent lines of the log function, the log function being represented by the difference between the best metric and the second best metric.

4. The constituent decoding method of claim 1, wherein the weighting factor is determined by $$\text{Weighting factor32 } K \cdot W_f \quad (13)$$

where $W_f$ is less than 1 and close to 1 and K is the mean inclination of tangent lines of a log function $1(x)=\log(1+e^{-x})$.

5. The constituent decoding method of claim 4, wherein $W_f$ is greater than 0.588235.

6. The constituent decoding method of claim 4, wherein the mean inclination of the tangent lines is an integer between 0 and 9.

7. A constituent decoder for decoding a turbo code, comprising:
   a first adder for calculating the difference between the best metric for a received information symbol being 1 and the best metric for the information symbol being 0 in a turbo decoding trellis at an arbitrary time point during turbo decoding the information symbol;
   a second adder for adding the transmission information and a priori information of the information symbol;
   a third adder for calculating the difference between the outputs of the first and second adders and outputting the difference as extrinsic information;
   a first multiplier for multiplying the output of the third adder by a predetermined weighting factor as a feedback gain;
   a correction value calculator for calculating a correction value using the difference between the best metric and second best metric of the received information symbol; and
   a fourth adder for adding the correction value to the output of the first multiplier.

8. The constituent decoder of claim 7, wherein the correction value calculator comprises:
   a fifth adder for calculating the difference between the best metric and the second best metric for the information symbol being 0;
   a sixth adder for calculating the difference between the best metric and the second best metric for the information symbol being 1;
   a look-up table for storing log function-based correction values for the outputs of the fifth and sixth adders and outputting correction values for the outputs of the fifth and sixth adders;
   a seventh adder for calculating the difference between the correction values;
   a second multiplier for multiplying the output of the seventh adder by a predetermined weighting factor;
   an eighth adder for calculating the difference between the outputs of the fifth and sixth adders;
   a third multiplier for multiplying the output of the eighth adder by the inclination of a linear function approximated from the log function; and
   a selector for selecting one of the outputs of the second and third multipliers according to the reliability of the signal to noise ratio (SNR) of the received information symbol.

9. The constituent decoder of claim 8, wherein if the weighting factor and the inclination of the linear function can be expressed as 2's exponents, each of the multipliers is implemented as a bit selector.

* * * * *